United States Patent
Sharangpani et al.

(10) Patent No.: US 9,570,455 B2
(45) Date of Patent: Feb. 14, 2017

(54) METAL WORD LINES FOR THREE DIMENSIONAL MEMORY DEVICES

(71) Applicant: SanDisk Technologies, Inc., Plano, TX (US)

(72) Inventors: Rahul Sharangpani, Fremont, CA (US); Raghuveer S. Makala, Campbell, CA (US); Senaka Krishna Kanakamedala, Milpitas, CA (US); Sateesh Koka, Milpitas, CA (US); Yao-Sheng Lee, Tampa, FL (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/553,207

(22) Filed: Nov. 25, 2014

(65) Prior Publication Data
US 2016/0148945 A1    May 26, 2016

(51) Int. Cl.
*H01L 27/115*    (2006.01)
*H01L 29/788*    (2006.01)
(Continued)

(52) U.S. Cl.
CPC ..... *H01L 27/11556* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS 5,084,417 A    1/1992    Joshi et al.
5,807,788 A    9/1998    Brodsky et al.
(Continued)

FOREIGN PATENT DOCUMENTS

WO    WO02/15277 A2    2/2002

OTHER PUBLICATIONS

International Search Report and Written Opinion for PCT/US2015/053179, dated Dec. 15, 2015, 16 pages.
(Continued)

*Primary Examiner* — Robert Carpenter
(74) *Attorney, Agent, or Firm* — The Marbury Law Group PLLC

(57) ABSTRACT

A method of making a monolithic three dimensional NAND string including forming a stack of alternating layers of insulating first material and sacrificial second material different from the first material over a major surface of the substrate, forming a front side opening in the stack, forming at least one charge storage region in the front side opening and forming a tunnel dielectric layer over the at least one charge storage region in front side opening. The method also includes forming a semiconductor channel over the tunnel dielectric layer in the front side opening, forming a back side opening in the stack and selectively removing at least portions of the second material layers to form back side recesses between adjacent first material layers. The method also includes forming electrically conductive clam shaped nucleation liner regions in the back side recesses and selectively forming ruthenium control gate electrodes through the back side opening in the respective electrically conductive clam shaped nucleation liner regions.

24 Claims, 18 Drawing Sheets

(51) Int. Cl.
  *H01L 21/28* (2006.01)
  *H01L 29/49* (2006.01)
  *H01L 21/285* (2006.01)
  *H01L 21/02* (2006.01)

(52) U.S. Cl.
  CPC .. *H01L 21/02532* (2013.01); *H01L 21/02592* (2013.01); *H01L 21/02595* (2013.01); *H01L 21/28273* (2013.01); *H01L 21/28282* (2013.01); *H01L 21/28556* (2013.01); *H01L 21/28568* (2013.01); *H01L 27/1157* (2013.01); *H01L 27/11524* (2013.01); *H01L 27/11582* (2013.01); *H01L 29/495* (2013.01); *H01L 29/7883* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,691,442 | B2 | 4/2010 | Gandikota et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,445,347 | B2 | 5/2013 | Alsmeier |
| 8,461,000 | B2 | 6/2013 | Alsmeier et al. |
| 8,580,639 | B2 | 11/2013 | Alsmeier et al. |
| 8,765,543 | B2 | 7/2014 | Alsmeier et al. |
| 9,230,983 | B1 * | 1/2016 | Sharangpani ..... H01L 27/11524 |
| 2002/0132469 | A1 * | 9/2002 | Lee ..................... H01L 21/2855 438/628 |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0256247 | A1 | 10/2012 | Alsmeier |
| 2013/0248974 | A1 | 9/2013 | Alsmeier et al. |
| 2013/0264631 | A1 | 10/2013 | Alsmeier et al. |
| 2013/0270631 | A1 | 10/2013 | Kim et al. |
| 2013/0313627 | A1 | 11/2013 | Lee et al. |
| 2014/0008714 | A1 | 1/2014 | Makala et al. |
| 2014/0131787 | A1 | 5/2014 | Alsmeier |
| 2014/0175530 | A1 | 6/2014 | Chien et al. |
| 2014/0225181 | A1 | 8/2014 | Makala et al. |

OTHER PUBLICATIONS

Han, J. H. et al., "Growth of RuO2 Thin Films by Pulsed-Chemical Vapor Deposition Using RuO4 Precursor and 5% H2 Reduction Gas," Chem. Mater. 2010, vol. 22, pp. 5700-5706, (2010).

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM—2010 Proceedings, Dec. 6-8, 2010, pp. 668-671.

Lim et al., "The Effect of CF4 Addition on Ru Etching with Inductively Coupled Plasma," Journal of the Korean Physical Society, vol. 42, Feb. 2003.

Lee et al., "Reactive Ion Etching Mechanism of RuO2 Thin Films in Oxygen Plasma with the Addition of CF4, Cl2, and N2," Abstract from 1998 Jpn. J. Appl. Phys. 37 2634.

Yunogami et al., "Anisotropic Etching of RuO2 and Ru with High Aspect Ratio for Gigabit Dynamic Random Access Memory," Abstract from J. Vac. Sci. Technol. B 18, 1911 (2000).

Elam et al., "Nucleation and Growth During Tungsten Atomic Layer Deposition on SiO2 Surfaces," Thin Solid Films, 386 (2001) pp. 41-52.

Park et al., " Thermal and Plasma Enhanced Atomic Layer Deposition Ruthenium and Electrical Characterization as a Metal Electrode," Microelectronic Engineering 85 (2008) pp. 39-44.

Thompson et al., "Stress Evolution During and After Deposition of Polycrystalline Thin Films," Department of Materials Science and Engineering, Massachusetts Institute of Technology.

R. Abermann, "Measurements of the Intrinsic Stress in Thin Metal Flims," Vacuum vol. 41, Nos. 4-6, pp. 1279-1282, 1990.

Endoh et al., "Novel Ultra High Density Memory with a Stacked-Surrounding Gate Transistor (S-SGT) Structured Cell," IEDM Proc. (2001) 33-36.

* cited by examiner

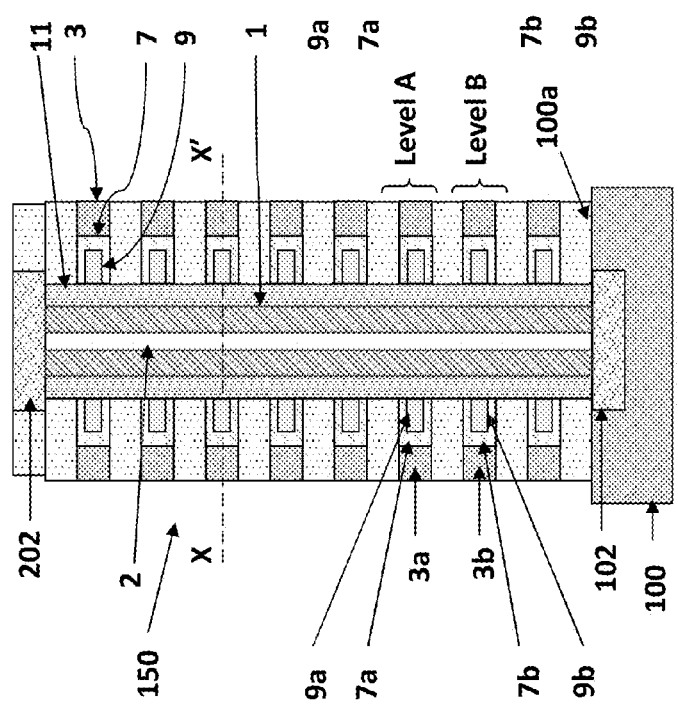
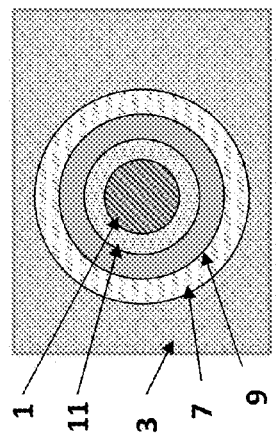
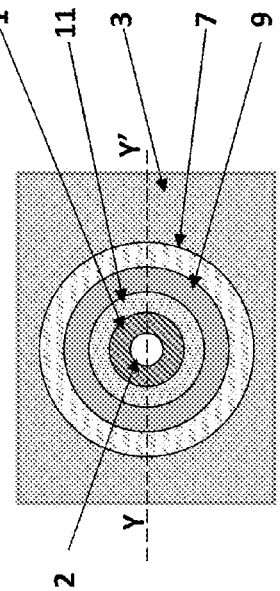
Fig. 1A
Fig. 1C
Fig. 1B

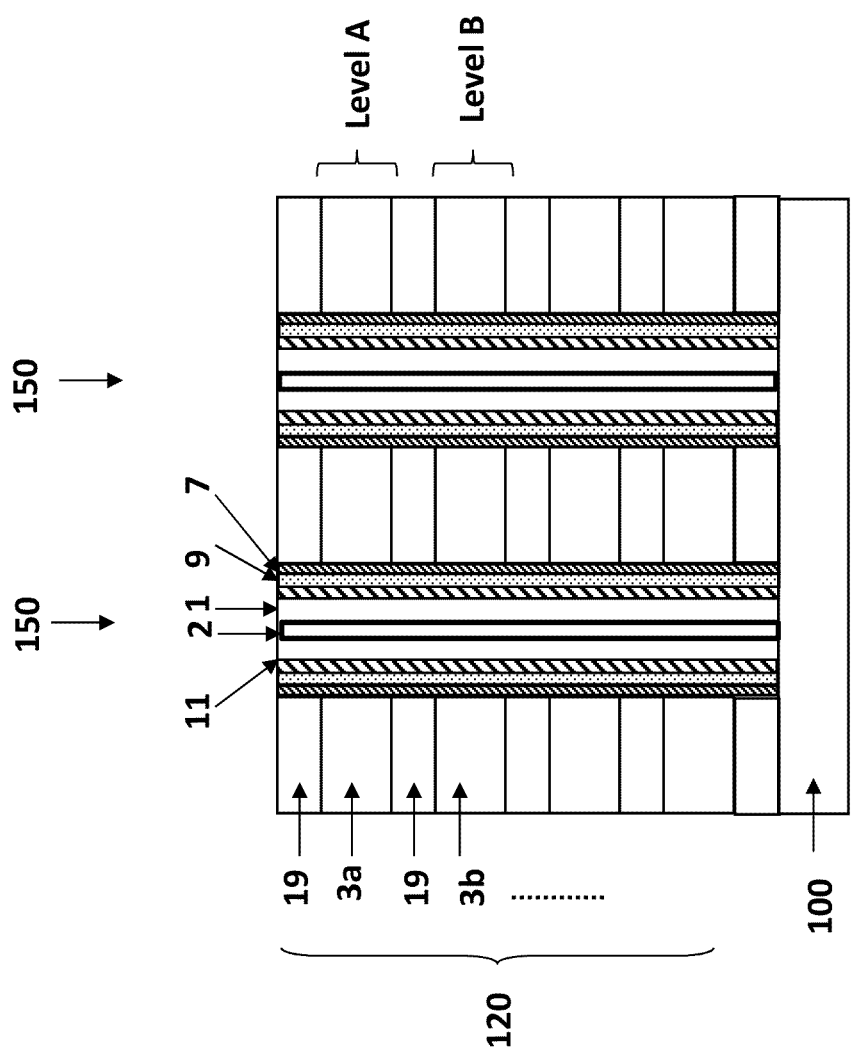

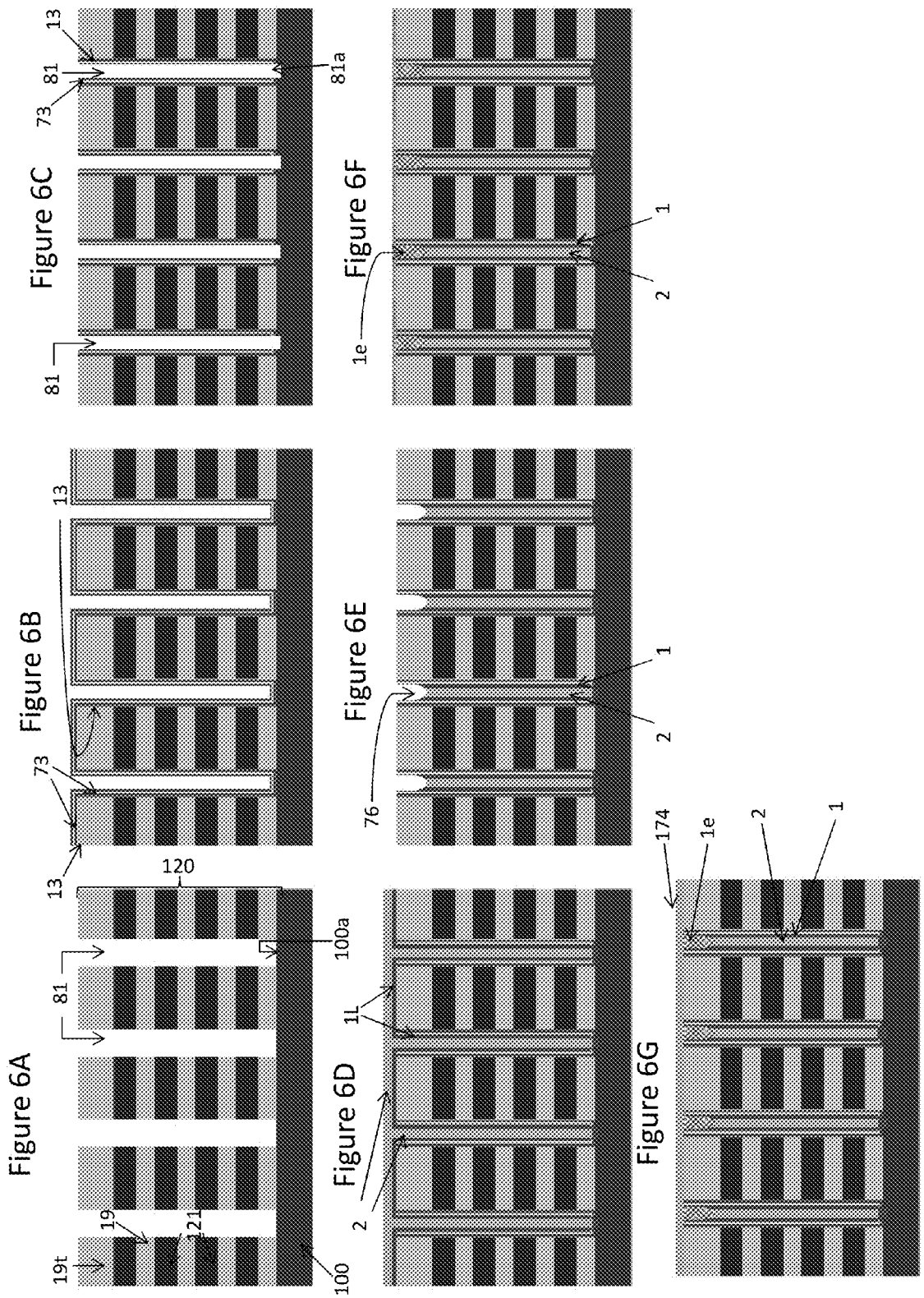

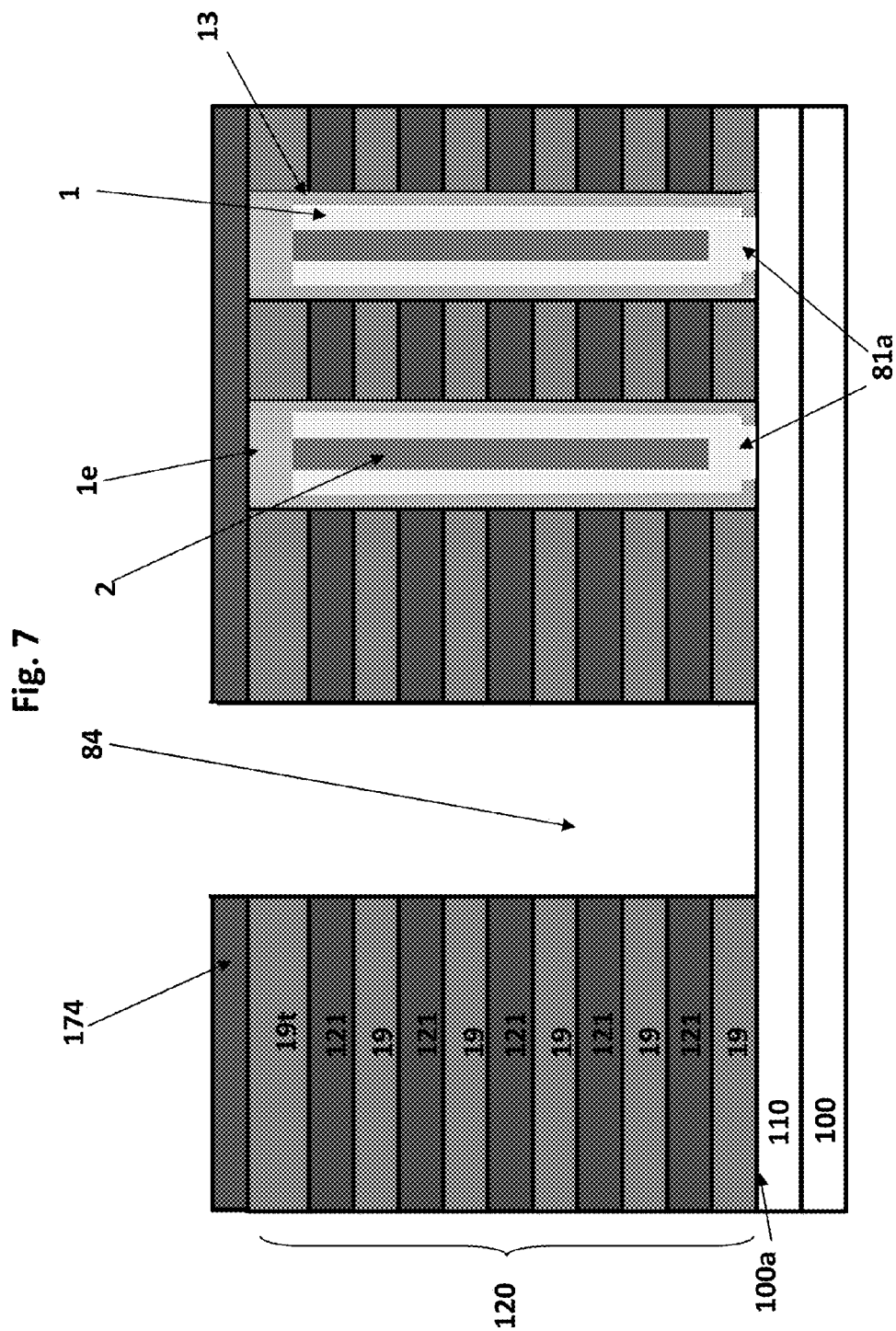

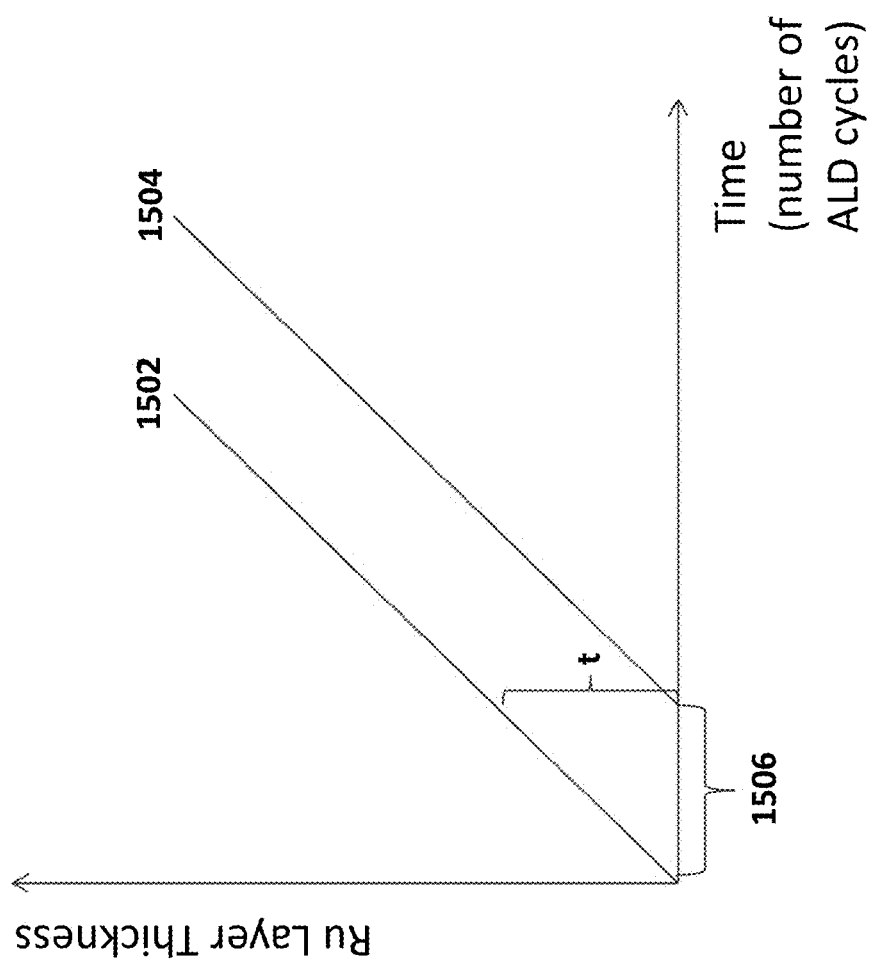

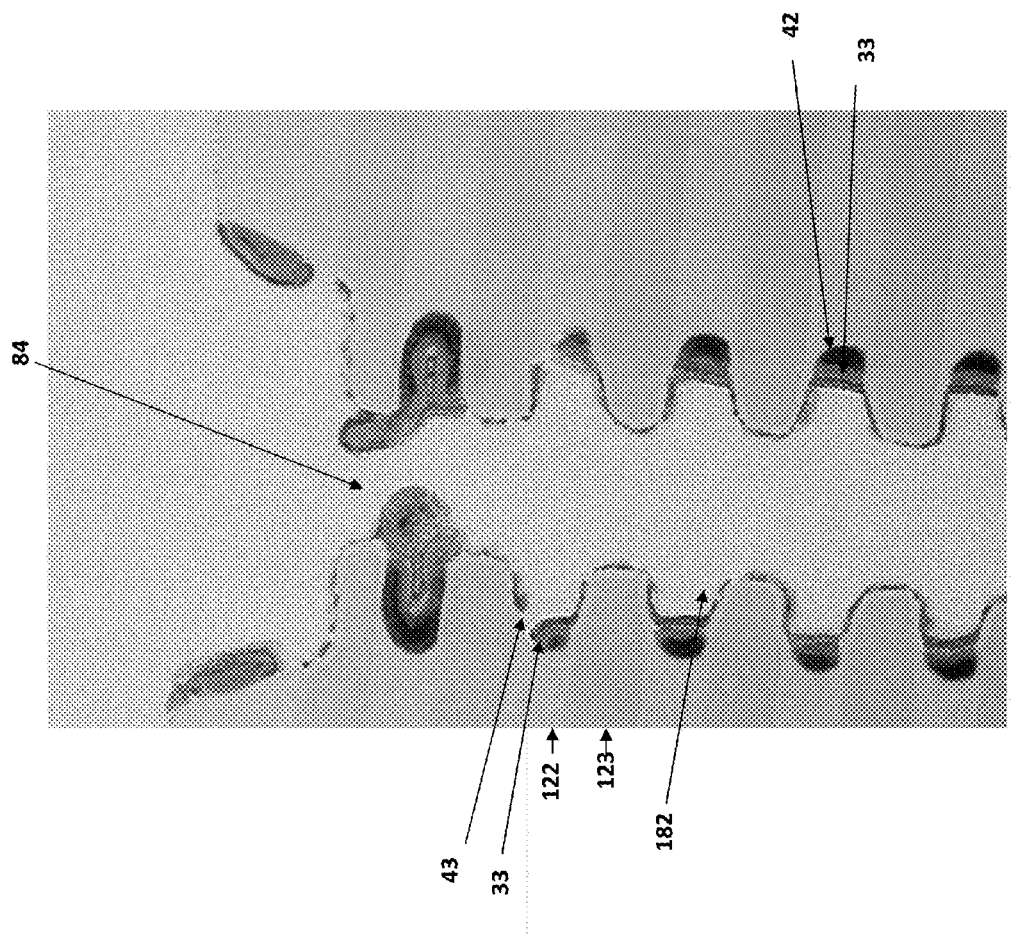

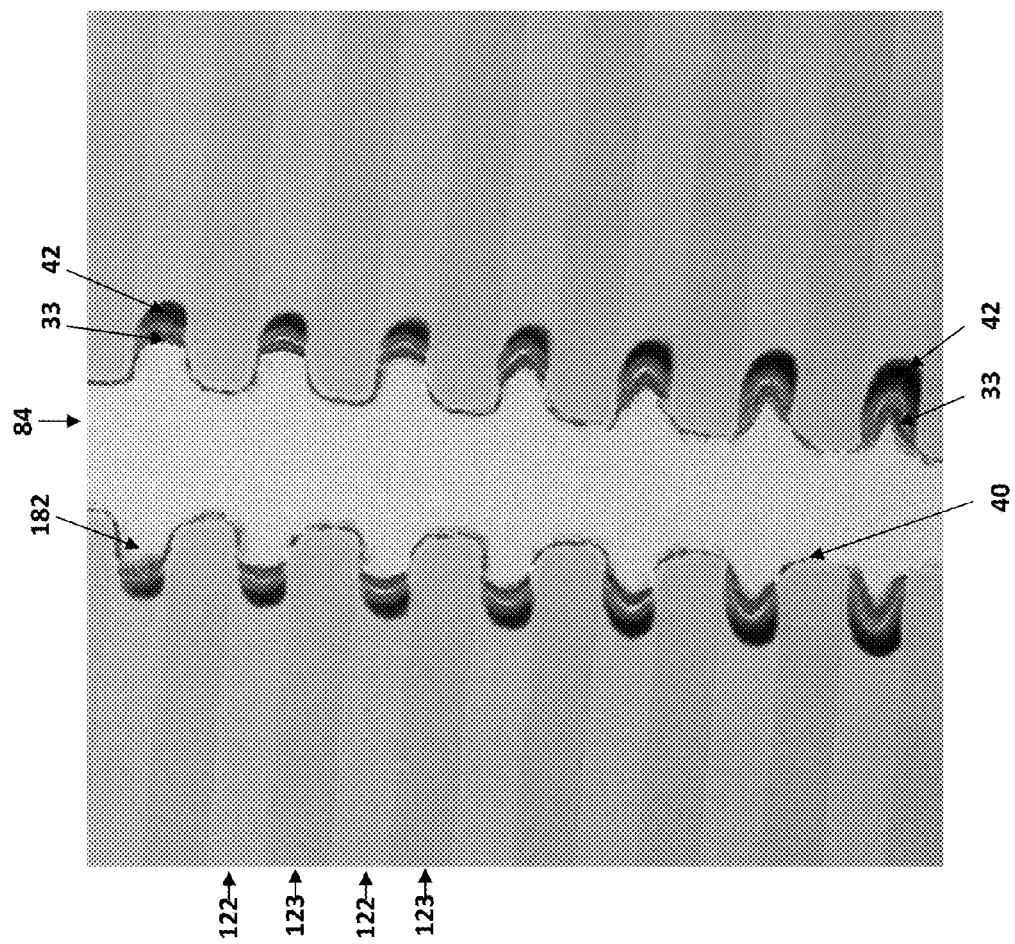

METAL WORD LINES FOR THREE DIMENSIONAL MEMORY DEVICES

FIELD

The present disclosure relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a method of making a monolithic three dimensional NAND string including forming a stack of alternating layers of insulating first material and sacrificial second material different from the first material over a major surface of the substrate, forming a front side opening in the stack, forming at least one charge storage region in the front side opening and forming a tunnel dielectric layer over the at least one charge storage region in front side opening. The method also includes forming a semiconductor channel over the tunnel dielectric layer in the front side opening, forming a back side opening in the stack and selectively removing at least portions of the second material layers to form back side recesses between adjacent first material layers. The method also includes forming electrically conductive clam shaped nucleation liner regions in the back side recesses and selectively forming ruthenium control gate electrodes through the back side opening in the respective electrically conductive clam shaped nucleation liner regions.

Another embodiment relates to a monolithic three dimensional NAND string including a semiconductor channel. At least one end portion of the semiconductor channel extending substantially perpendicular to a major surface of a substrate. The NAND string also includes a plurality of ruthenium control gate electrodes extending substantially parallel to the major surface of the substrate. The plurality of control gate electrodes include at least a first control gate electrode located in a first device level and a second control gate electrode located in a second device level located over the major surface of the substrate and below the first device level. The NAND string also includes electrically conductive clam shaped nucleation liner regions located in contact with the plurality of ruthenium control gate electrodes, a blocking dielectric located in contact with the electrically conductive clam shaped nucleation liner regions, at least one charge storage region located in contact with the blocking dielectric and a tunnel dielectric located between the at least one charge storage region and the semiconductor channel.

BRIEF DESCRIPTION OF THE DRAWINGS

FIGS. 1A and 1B are respectively side cross sectional and top cross sectional views of a NAND string according to one embodiment. FIG. 1A is a side cross sectional view of the device along line Y-Y' in FIG. 1B, while FIG. 1B is a side cross sectional view of the device along line X-X' in FIG. 1A. FIG. 1C is a top cross sectional view of a NAND string according to an alternative embodiment.

FIG. 3 is a side cross sectional view of another embodiment NAND string.

FIG. 4B is a side cross sectional view of the device along line B-B' in FIG. 4A, while FIG. 4C is a side cross sectional view of the device along line W-W' in FIG. 4A.

FIGS. 6A-6G illustrate a method of making NAND strings according to an embodiment.

FIGS. 7, 8, 9A-9C, 10A-10C and 11 to 14 illustrate a method of forming metal replacement gates in the NAND strings of the previous embodiments.

FIG. 15 is a plot of ruthenium layer thickness versus time expressed as a number of ALD cycles comparing the growth as a function of time (i.e. ALD cycles) of a first ruthenium layer grown on a nucleation liner and a second ruthenium layer grown on a dielectric layer without a nucleation liner.

FIGS. 17A and 17B are micrographs illustrating selective deposition of ruthenium regions on a nucleation liner according to an embodiment.

DETAILED DESCRIPTION

Figure 2:
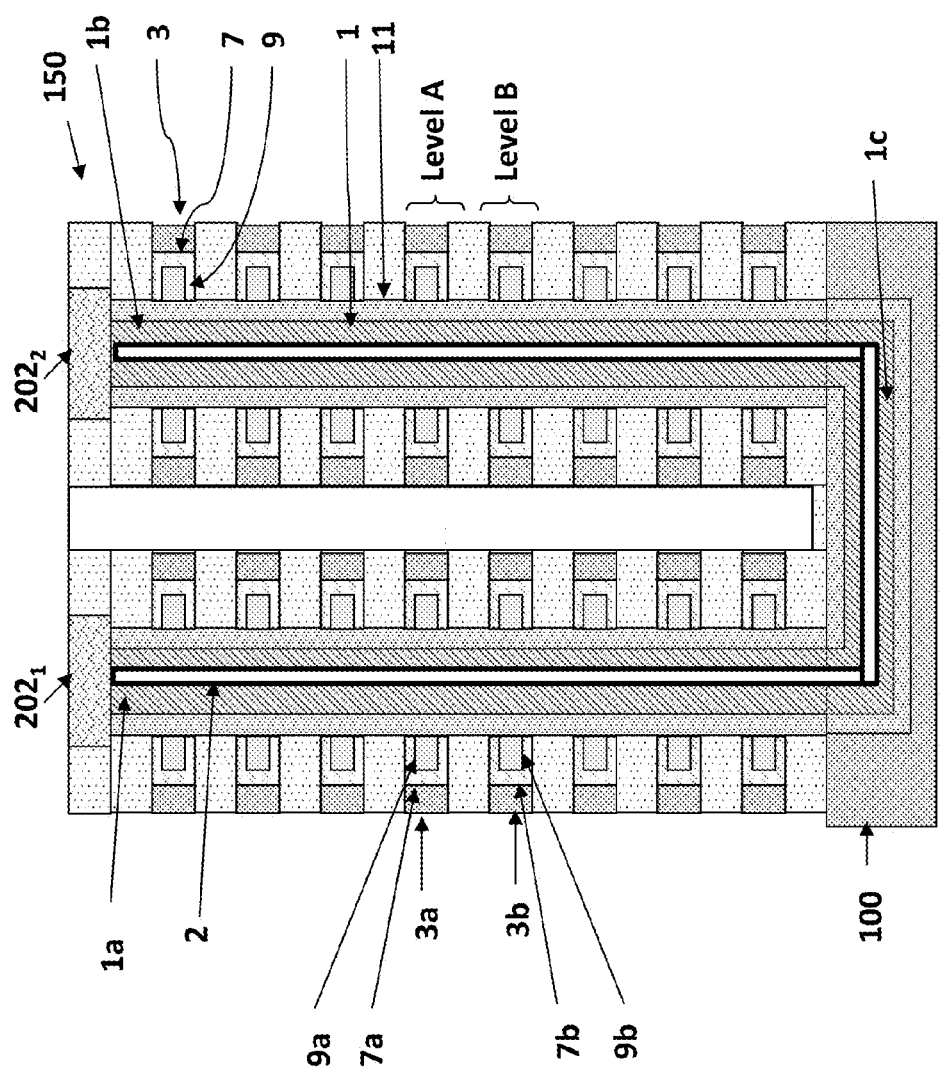
FIG. 2 is a side cross sectional view of a NAND string of another embodiment with a U-shaped channel.

The present inventors have realized that selectively deposited ruthenium control gate electrodes of three dimensional NAND string memory devices are unexpectedly advantageous over conventional tungsten control gate electrodes and word lines. The present inventors have further realized that excess control gate material in the back side openings may generate undesirable stress on the NAND device and underlying substrate, leading to warping of the substrate. However, the present inventors have also realized that when using an atomic layer deposition process for the deposition of ruthenium, the ruthenium can be selectively deposited inside recesses in the NAND stack to form control gate electrodes/word lines without depositing ruthenium in the back side openings. As discussed in more detail below, the ruthenium may be selectively deposited in the recesses by first forming a nucleation liner that is only located in the recesses and not in the back side opening. The liner may be thinner than the control gate electrodes, which results in a lower metal volume in the back side opening. Furthermore, the selective ruthenium deposition in the recesses also avoids the ruthenium etching from the back side opening which increases the process throughput and decreases the process cost.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 150 comprises a semiconductor channel 1 having at least one end portion extending substantially perpendicular to a major surface 100a of a substrate 100, as shown in FIGS. 1A, 2, 3, 4B and 4C. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A and 3. In these embodiments, the source/drain electrodes of the device can include a lower electrode 102 provided below the semiconductor channel 1 and an upper electrode 202 formed over the semiconductor channel 1, as shown in FIG. 1A.

Figure 4C:
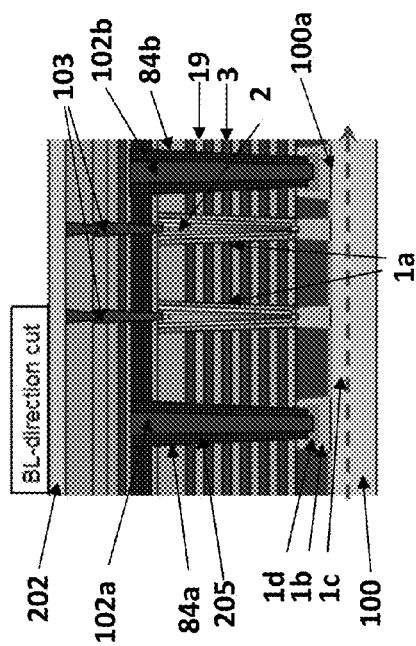
FIGS. 4B and 4C are side cross sectional views of the memory block of FIG. 4A along the bit line and word line directions, respectively.
Figure 5B:
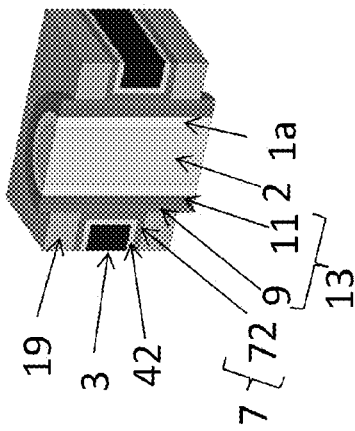
FIG. 5B is a close up, cross sectional view of one memory cell of FIG. 5A.
Figure 5A:
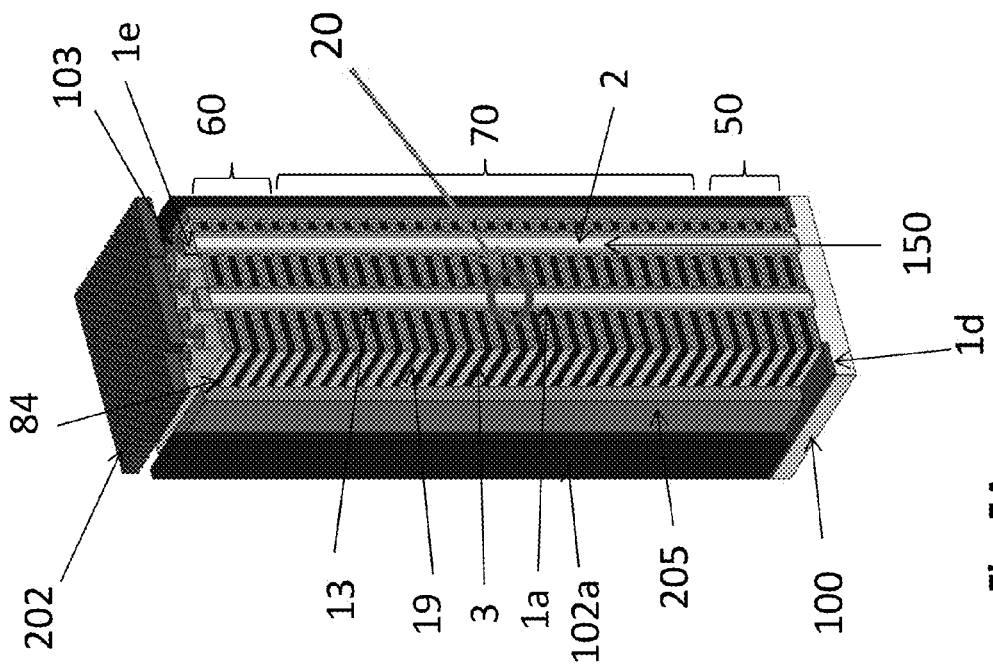
FIG. 5A is a cut-away, three dimensional perspective of the device of FIGS. 4A-4C, but with the optional lower semiconductor pillar omitted.

Alternatively, the semiconductor channel 1 may have a U-shaped pipe shape, as shown in FIG. 2. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1A-3 for clarity. However, the source side select transistor 50 and drain side select transistor 60 are shown in FIGS. 4C and 5A. These transistors may have one select gate per side as shown in FIG. 4C or plural select gates per side as shown in FIG. 5A.

The semiconductor channel 1 may be a cylinder containing an insulating material 2, such as $SiO_2$ located in the middle region (e.g., core region), as shown in FIGS. 1A, 1B, 2, 3, 4B, 4C, 5A and 5B. Alternatively, the core fill insulating material 2 may be omitted and the channel 1 may comprise a solid silicon rod, as shown in FIG. 1C.

Figure 4A:
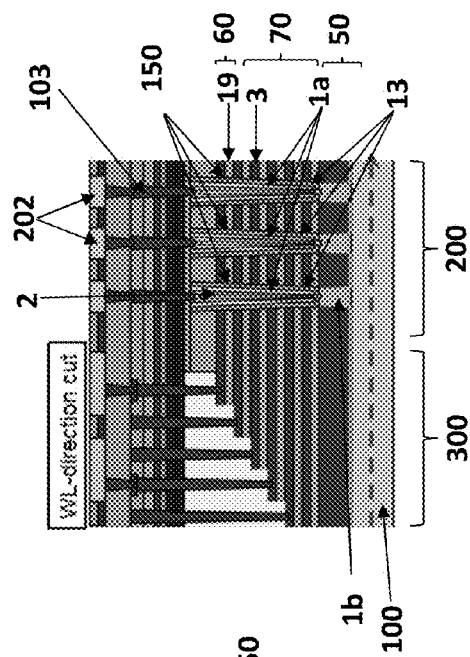
FIG. 4A is a top cross sectional view of a memory block of an embodiment.
Figure 4B:
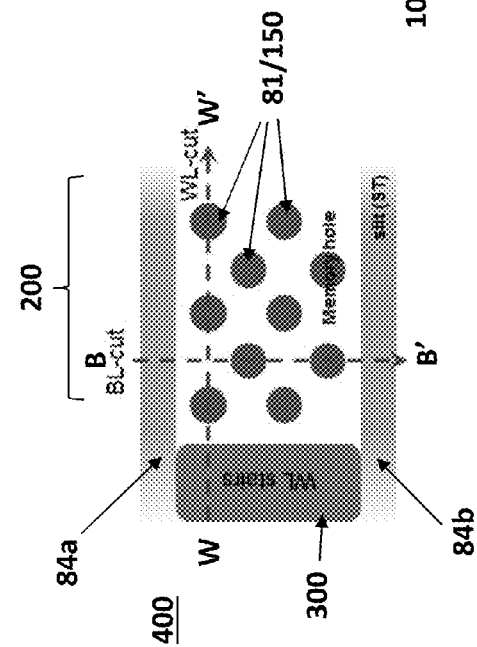

FIGS. 4A to 4C illustrate a memory block 400 containing an array of a plurality of vertical NAND strings 150 according to another embodiment. Each string includes the memory device levels 70, respectively, as shown in FIG. 4C. FIGS. 4A and 4C show the location of memory region 200 and the stepped word line contact region 300. FIG. 5A shows a three dimensional view of the device similar to that shown in FIGS. 4A-4C, except that the silicon pillar 1b under the source 1d and the silicon pillar 1b under channel portion 1a are omitted and plural select transistors 50, 60 are located on each side of the channel in FIG. 5A. FIG. 5B shows a close up of one memory cell 20 of the device of FIG. 5A.

A first source electrode (or source line) 102a is located in the first dielectric filled slit trench 84a and a second source electrode 102b is located in the second dielectric filled slit trench 84b in each block 400, as shown in FIGS. 4A, 4B and 5A. In the memory device levels 70, the dielectric fill in the slit trench 84 may comprise any suitable insulating layer 205, such as silicon oxide, etc., which is located on both walls of the slit trench 84. The source electrode 102 is located in the middle of the slit trench 84 and is separated from the ruthenium control gate electrodes 3 by the insulating layer 205, as shown in FIGS. 4B and 5A. Drain electrodes (e.g., bit lines) 202 and drain lines 103 are located over the NAND memory cell region in memory device levels 70.

As discussed above, each NAND string 150 contains a NAND memory cell region in the memory device levels 70 which includes the semiconductor channel 1 which contains a portion 1a which extends substantially perpendicular to the major surface 100a of the substrate 100. A bottom portion 1c of the channel 1 is located in or over the major surface 100a of the substrate 100, and extends toward the doped source region 1d substantially parallel to the major surface of the substrate. A drain region 1e is located in the upper part of the channel portion 1a in contact with a respective drain line 103, as shown in FIG. 5A. An optional semiconductor pillar may form an optional vertical portion 1b of the channel which extends substantially perpendicular to the major surface 100a of the substrate 100 and which contacts the source region 1d. The source region 1d may be located in the pillar above portion 1b of the channel or in the major surface 100a of the substrate.

The device contains a plurality of control gate electrodes 3 that extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain electrode (e.g., bit line) 202 electrically contacts an upper portion of the semiconductor channel 1 via drain lines 103.

Furthermore, each NAND string 150 contains at least one memory film 13 which is located adjacent to the semiconductor channel 1 (e.g., at least next to portion 1a of the channel) in the memory device levels 70, as shown in FIG. 4C. Specifically, the memory film 13 is located between the semiconductor channel 1 and the plurality of control gate electrodes 3. Each memory cell 20 includes a portion of the channel 1, a control gate electrode 3 and a portion of the memory film 13, as shown in FIGS. 5A and 5B. The memory film 13 contains the tunnel dielectric 11, the charge storage region(s) 9 (e.g., a charge trapping layer or floating gates), and optionally the blocking dielectric 7, as shown in FIG. 5B. In alternative embodiments, the blocking dielectric 7 may be formed as clam shaped regions located between insulating layers separating adjacent device levels as illustrated in FIGS. 1A and 2.

As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration.

The clam shape preferably contains an opening bounded by the three segments and having a fourth side open.

Each part of the memory film 13, such as the tunnel dielectric 11, the charge storage region 9, and/or the blocking layer 7 may be comprised of one or more layers (e.g., one or more dielectric layers) made of different materials. The charge storage region 9 may comprise a plurality of discrete floating gates or a continuous charge storage dielectric layer.

As shown in FIG. 4C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials. Alternatively, the core fill material 2 may be omitted and the channel 1 may comprise a solid silicon rod, as shown in FIG. 1C.

The monolithic three dimensional NAND string further comprise a plurality of ruthenium control gate electrodes 3, as shown in FIGS. 1A to 5B. The control gate electrodes 3 may comprise a portion having a strip shape extending substantially parallel to the major surface 100a of the substrate 100. The plurality of control gate electrodes 3 comprise ruthenium.

A blocking dielectric 7 is located adjacent to the control gate(s) 3 and may surround the control gate electrodes 3, as shown in FIGS. 1A and 2. Alternatively, a straight blocking dielectric layer 7 may be located only adjacent to an edge (i.e., minor surface) of each control gate electrode 3, as shown in FIG. 3. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 2. Alternatively, the blocking dielectric 7 may be a straight, continuous layer, as shown in FIG. 3, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIGS. 3 and 5A. For example, the charge storage region 9 may comprise an insulating charge trapping material, such as a silicon nitride layer.

Alternatively, the charge storage region may comprise a plurality of discrete charge storage regions 9, as shown in FIGS. 1A and 2. The plurality of discrete charge storage regions 9 comprise at least a first discrete charge storage region 9a located in the device level A and a second discrete charge storage region 9b located in the device level B, as shown in FIGS. 1A and 2. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) and/or high-k materials such as aluminum oxide, hafnium oxide or combinations thereof. For example, the blocking dielectric 7 may comprise at least one inner blocking dielectric layer (e.g. made of silicon oxide) adjacent to the charge storage region 9 and an outer metal oxide layer (e.g., aluminum oxide) adjacent to the ruthenium control gate 3. For example, the blocking dielectric 7 may comprise a plurality of clam shaped regions 72, such as metal oxide regions, and the plurality of ruthenium control gate electrodes 3 are located in respective openings in respective metal oxide clam shaped regions 72, as shown in FIG. 5B. If desired, the inner blocking dielectric layer may be formed as the inner part of the clam shaped regions or it may comprise a straight, continuous blocking dielectric layer. The electrically conductive clam shaped nucleation liner regions 42 are located in contact with the blocking dielectric 7 and the plurality of ruthenium control gate electrodes 3 are located in respective openings in the respective electrically conductive clam shaped nucleation liner regions 42.

The blocking dielectric 7, charge storage region(s) 9 and the tunnel dielectric 11 together is also referred to herein as a memory film 13, as shown in FIGS. 4B, 4C and 5B.

In summary, at least the portion 1a of the semiconductor channel 1 comprises cylinder shaped channel. The tunnel dielectric 11 comprises a cylinder which surrounds the semiconductor channel 1 (e.g., at least portion 1a of channel 1). As described above, the tunnel dielectric 11 may comprise a single insulating layer or a stack of a plurality of insulating layers comprised of different materials. The at least one charge storage region 9 comprises a cylinder shaped plurality of vertically spaced apart floating gates or a cylinder shaped dielectric charge storage layer which surrounds the tunnel dielectric 11. The blocking dielectric 7 comprises a cylinder which surrounds the at least one charge storage region 9. As described above, the blocking dielectric may comprise a single insulating layer or a stack of a plurality of insulating layers comprised of different materials. The control gate electrodes 3 surround the blocking dielectric 7.

FIGS. 6A-6G illustrate a method of making vertical NAND strings according to an embodiment. As illustrated in FIG. 6A, a stack 120 of alternating first material layers 19 and second material layers 121 is provided over a major surface 100a of a substrate 100. The first material layers 19 comprise an insulating material and the second material layers 121 comprise sacrificial layers. In an embodiment, the first material layers 19 comprise silicon oxide and the second material layers 121 comprise polysilicon, amorphous silicon, or silicon nitride.

If desired, a top insulating layer 19t may have a greater thickness and/or a different composition from the other insulating layers 19. For example, the top insulating layer 19t may comprise a cover silicon oxide layer made using a TEOS source while the remaining layers 19 may comprise thinner silicon oxide layers may using a different source. The method includes forming front side openings 81 by RIE or another suitable etching method. The stack 120 includes a plurality of front side openings 81 (e.g. a plurality of cylindrical memory holes shown in FIG. 1B).

As shown in FIG. 6B, the next step includes forming at least a portion of the memory film 13 in the front side openings 81. For example, the tunnel dielectric 11 is formed in the front side opening 81. If desired, the blocking dielectric 7 and/or the charge storage region(s) 9 portions of the memory film may also be formed in the front side openings 81 prior to forming the tunnel dielectric 11, such that the entire memory film 13 is formed in the front side openings 81, as shown in FIG. 6B. Thus, in this embodiment, the method include forming the blocking dielectric layer 7 in the front side openings 81, forming the at least one charge storage region 9 over the blocking dielectric layer 7 in the front side openings, and forming the tunnel dielectric layer 11 over the at least one charge storage region 9 in the front side openings.

Alternatively, the blocking dielectric 7 and/or the charge storage region(s) 9 may be formed from the back side through the back side opening 84 and back side recesses as shown in FIG. 5B and as will be described in more detail below with respect to FIGS. 7-14. In an embodiment, the blocking dielectric 7 comprises a metal oxide blocking dielectric 72, as shown in FIG. 5B.

If desired, an optional cover layer 73, such as an amorphous silicon layer, is formed over the tunnel dielectric portion of the memory film 13, as shown in FIG. 6B. The cover layer 73 and the memory film 13 are then anisotropically etched to remove the cover layer 73 and the memory film 13 from the bottom portions 81a of the front side openings 81 while leaving layer 73 and film 13 on the sidewalls of the front side openings 81, as shown in FIG. 6C. This etching step exposes the upper surface (i.e., major surface 100a) of the substrate 100 in the bottom portions 81a of the front side openings 81. Layer 73 protects the tunnel dielectric portion of the memory film 13 during the etching step. If desired, layer 73 may be removed after the etching step. Alternatively, if layer 73 comprises a semiconductor material, such as silicon, then it may be retained in the device to become part of the channel.

Then, as shown in FIG. 6D, the semiconductor channel layer 1L and the optional insulating core layer 2 are formed over the upper portion of the stack 120 and in the front side openings 81. Layers 1L and 2 are then recessed by etch back to leave recesses 76 in the upper portions of the openings 81 over the semiconductor channel 1 and the insulating core layer 2, as shown in FIG. 6E.

Then, as shown in FIG. 6F a doped semiconductor drain region 1e is formed in electrical contact with the upper portion of the semiconductor channel 1. The drain region 1e may be formed by depositing a semiconductor cap layer (e.g., amorphous silicon or polysilicon cap layer) and implanting dopants (e.g., N-type dopants, such as arsenic or phosphorus). The cap layer is then planarized by etched back or CMP even with the top insulating layer in the stack to leave the drain regions 1e in contact with the upper part of the channel layer. This stage of the process is then completed by forming a cover layer 174, such as a silicon oxide cover layer using a TEOS source, over the entire device, as shown in FIG. 6G.

Then, the ruthenium control gate electrodes 3, and optionally the blocking dielectric 7 and/or the charge storage region(s) 9 may be formed by a replacement process through a back side opening 84, as shown in FIGS. 7-14.

FIG. 7 illustrates the device following the filling of the front side openings 81 and formation of the cover layer 174 as discussed above. As shown in FIG. 7, the back side opening 84 (e.g., the slit trench shown in FIGS. 4A, 4B and 5A) is then formed in the stack 120 by any suitable lithography and etching steps to expose a p-type doped well (e.g., p-well) 110 in the substrate 100.

Figure 8:
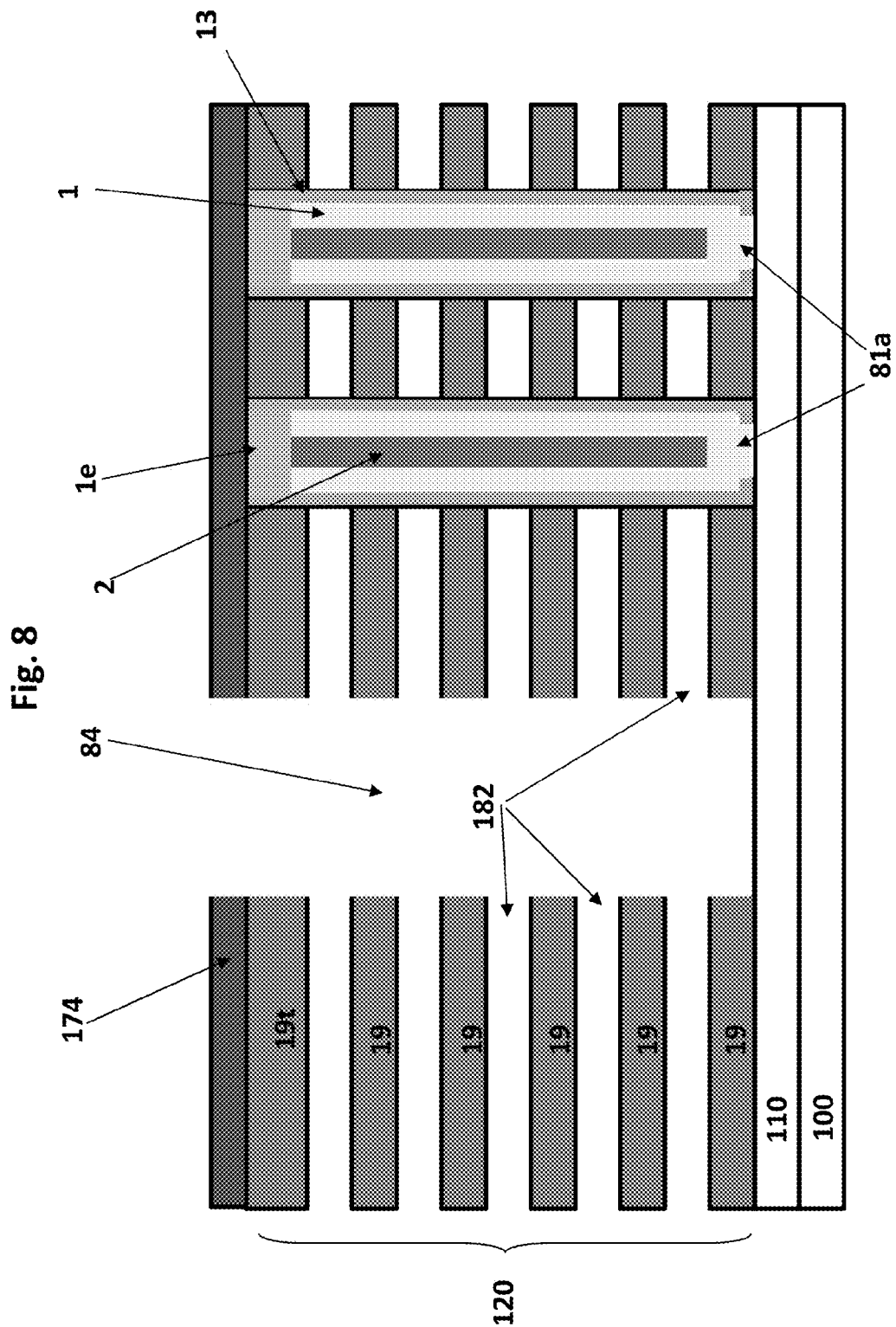

Then, at least a portion of the sacrificial second material layers 121 are selectively removed through the back side openings 84 selectively etching the silicon nitride layers 121 to form back side recesses 182 between the first material layers 19, as shown in FIG. 8. Layers 121 may be fully removed as shown in FIG. 8. Alternatively, layers 121 may be partially removed as shown in FIG. 15 such that the recesses 182 terminate at the remaining portions of respective layers 121. For example, layers 121 may be removed by selective etching, such as a silicon nitride selective etching which removes silicon nitride layers 121 but does not remove the silicon oxide layers 174, 19 or the silicon regions. The selective etch may stop on the oxide blocking dielectric, such as a silicon oxide blocking dielectric 7 which forms the outer part of the memory film 13.

Alternatively, the blocking dielectric 7 may be formed from the back side in the back side recesses prior to the control gate electrodes 3. In this embodiment, forming the blocking dielectric layer 7 comprises forming the blocking dielectric layer 7 in the back side opening 84 and in the back side recesses 182.

If desired, the at least one charge storage region 9 may be formed through either the front side opening 81 or the back side opening 84. Thus, the step of forming the at least one charge storage region 9 comprises at least one of forming the at least one charge storage region 9 prior to forming the blocking dielectric 7 in the back side opening 84 or forming the at least one charge storage region 9 over the blocking dielectric 7 in the front side opening 81 or over the sidewall in the front side opening 81 (if the blocking dielectric 7 is formed through the back side opening 84).

Figure 9C:
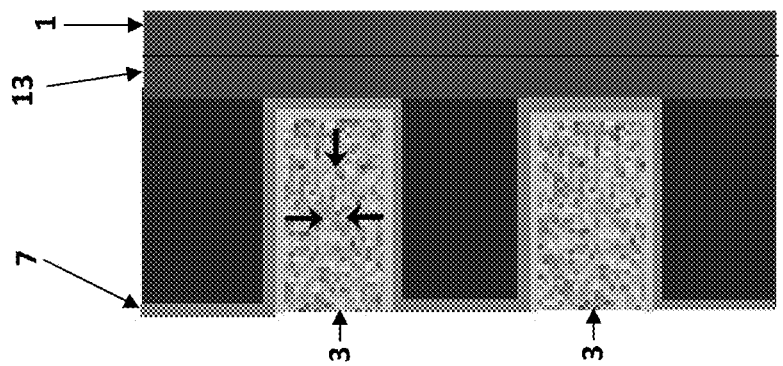
Figure 9B:
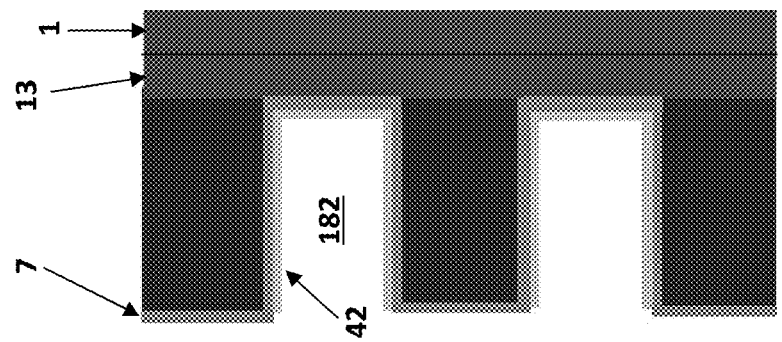
Figure 9A:
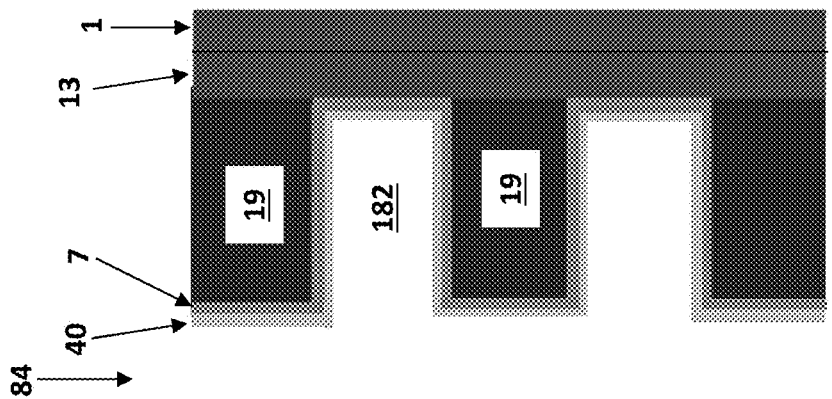

Ruthenium control gate electrodes 3 may then formed in the back side recesses 182 through the back side openings 84, as shown in FIGS. 9A-9C. As illustrated in FIG. 9A, a blocking dielectric 7 is first formed inside the back side recesses 182 and the back side opening 84 via the back side opening in 84. Next, a nucleation liner layer 40 is deposited over the blocking dielectric 7 in the back side opening 84 and the back side recesses 182. The blocking dielectric 7 may be an insulating (dielectric) material, such as silicon oxide, aluminum oxide or another metal oxide. The nucleation liner layer 40 may be made of any material that nucleates ruthenium. Suitable materials for the nucleation liner layer 40 include, but are not limited to, tungsten, tungsten, titanium nitride, ruthenium nitride or tantalum nitride. In an embodiment, the material of the nucleation liner layer 40 is electrically conductive.

Next, as illustrated in FIG. 9B, the portion of the nucleation liner layer 40 in the back side opening 84 is selectively removed, thereby exposing the insulating blocking dielectric 7 in the back side opening 84. The portion of the nucleation liner layer 40 in the back side opening 84 may be selectively removed, for example, by isotropic etching. After removing a portion of the nucleation liner layer 40 from the back side opening 84, discrete electrically conductive clam shaped nucleation liner regions 42 remain in the back side recesses 182.

Then, as illustrated in FIG. 9C, ruthenium may be selectively deposited in the back side recesses 182 to form the control gates 3, without depositing ruthenium in the back side opening 84 on the exposed blocking dielectric 7. Specifically, the back side recesses 182 can be filled with ruthenium by growing ruthenium in the discrete electrically conductive clam shaped nucleation liner regions 42 prior to the expiration of the incubation period and ruthenium growth on the exposed portions of the blocking dielectric 7 in the back side opening 84. Selectively filling the back side recesses 182 results in a plurality of ruthenium control gate electrodes 3 that are separated from each other in a direction perpendicular to the major surface 100*a* of the substrate 100 by first material layers 19 (e.g. silicon oxide layers).

Figure 10A:
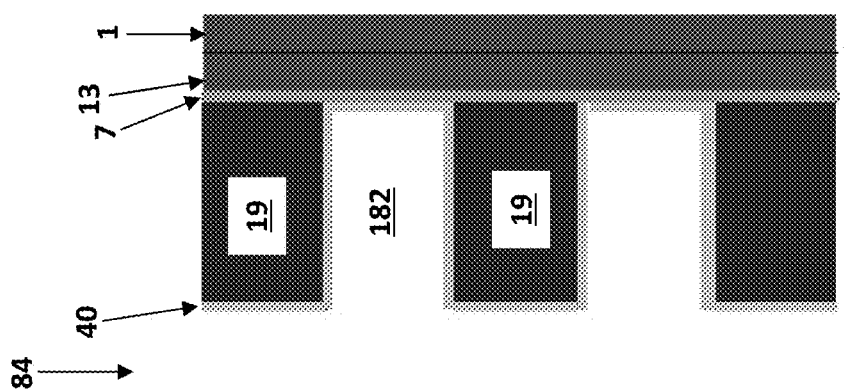
Figure 10B:
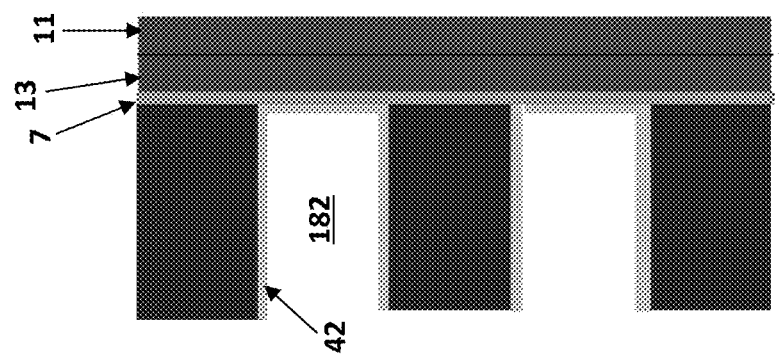
Figure 10C:
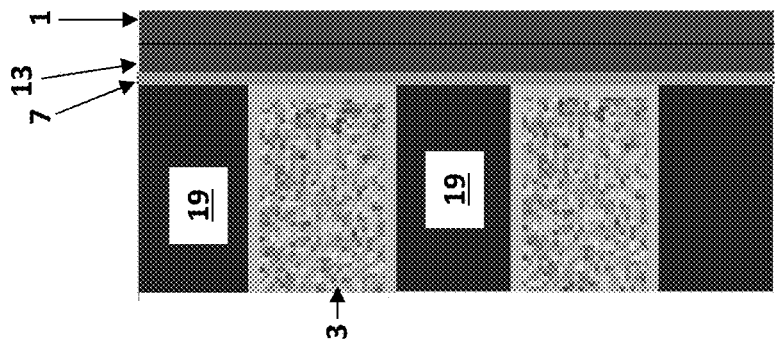

FIGS. 10A-10C illustrate an alternative method of forming ruthenium control gate electrodes 3 in the back side recesses 182 through the back side openings 84. In this method the blocking dielectric 7 is formed in the front side opening 81 prior to removing the sacrificial layers 121. In this embodiment, the nucleation liner layer 40 is formed in the back side opening 84 without first forming a blocking dielectric 7 in the back side opening 84 and back side recesses 182, as illustrated in FIG. 10A.

As illustrated in FIG. 10B and similar to the embodiment illustrated in FIG. 9, the portion of the nucleation liner layer 40 in the back side opening 84 is selectively removed to leave discrete electrically conductive clam shaped nucleation liner regions 42 in the back side recesses 182 and exposing edge portions of the first material layers 19 in the back side opening 84.

Next, as illustrated in FIG. 10C, ruthenium is selectively deposited in the discrete electrically conductive clam shaped nucleation liner regions 42 in the back side recesses 182. That is, ruthenium only deposits in the discrete electrically conductive clam shaped nucleation liner regions 42 and not on the exposed portions of the first material layers 19 in the back side opening 84. Specifically, the back side recesses 182 can be filled with ruthenium by growing ruthenium in the discrete electrically conductive clam shaped nucleation liner regions 42 prior to the expiration of the incubation period and ruthenium growth on the exposed edge portions of the first material layers (e.g., silicon oxide layers 19) in the back side opening 84.

The ruthenium control gate material is may be deposited by atomic layer deposition (ALD). The ruthenium material may be formed by supplying a volatile ruthenium precursor, such as $RuO_4$. One or more $RuO_2$ monolayers may be formed using atomic layer deposition. The one or more $RuO_2$ monolayers may be exposed to a reducing atmosphere to fully or partially reduce the deposited one or more $RuO_2$ monolayers to one or more Ru monolayers. The $RuO_2$ deposition and Ru reducing steps (i.e., 1 ALD cycle) may be repeated multiple times to form the plurality of control gate electrodes 3. A hydrogen based forming gas, such as 4% hydrogen and 96% nitrogen, may be supplied as the reducing atmosphere for the ruthenium oxide. The atomic layer deposition may be performed by cycling, such as with more than 25 cycles, such as 25-40 cycles, to form continuous strips of Ru. In an embodiment, the ALD process optionally further includes annealing the ruthenium layer using rapid thermal annealing at a temperature between 900 and 1000 C.

Figure 11:
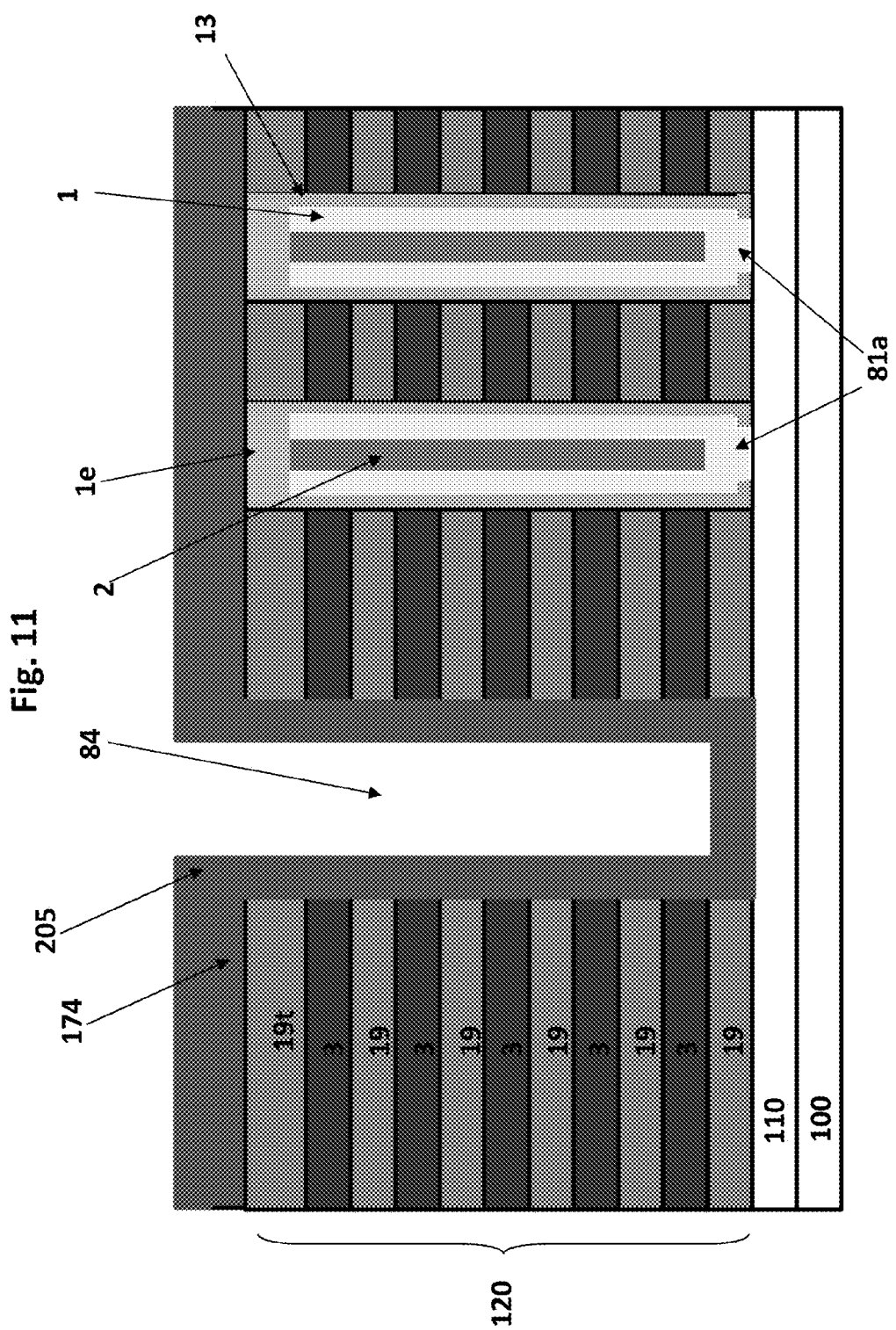
Figure 12:
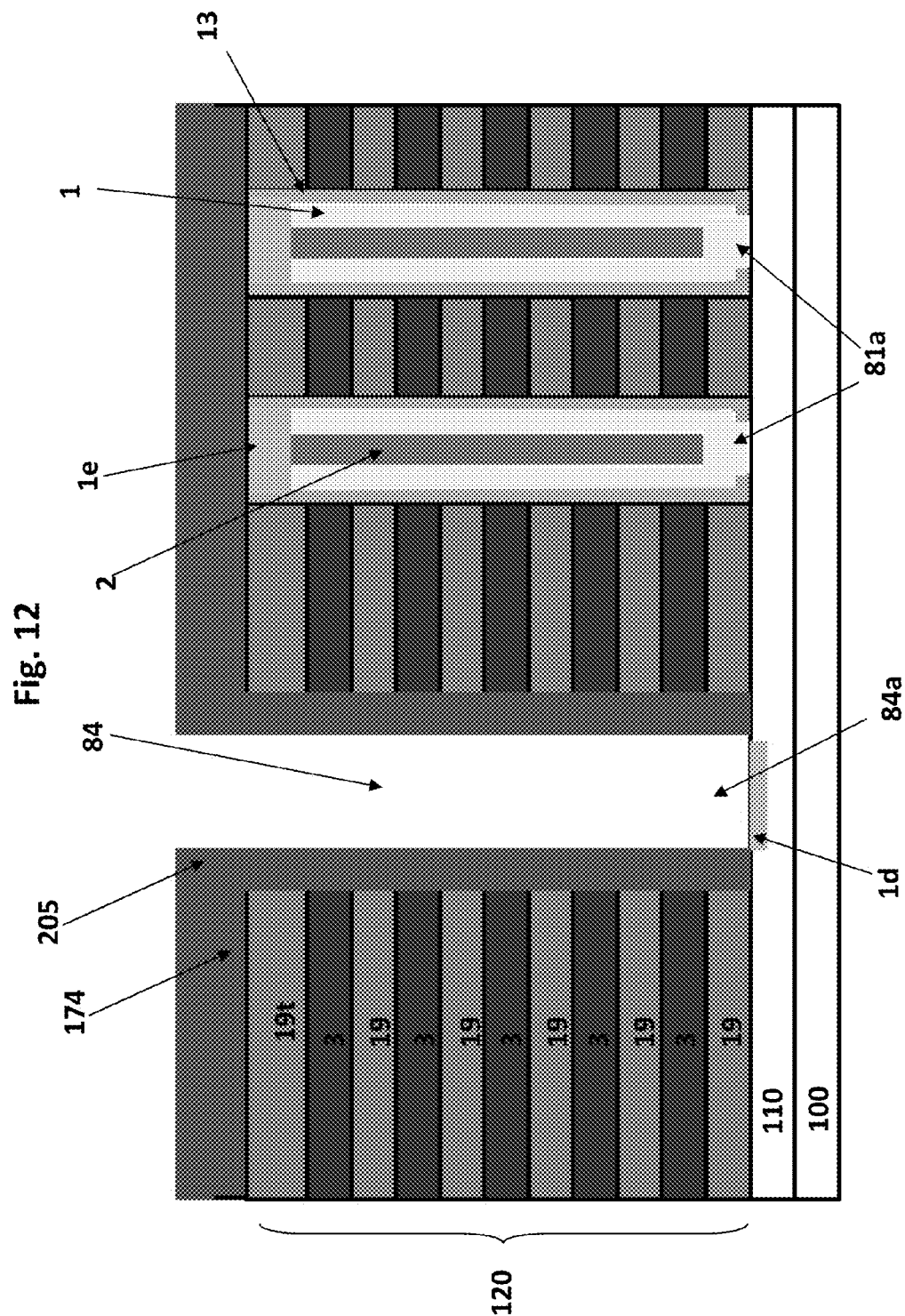

Next, an insulating layer 205, such as a silicon oxide layer, is formed on sidewalls and bottom of the back side trenches 84, as shown in FIG. 11. Layer 205 is also formed over layer 174. The insulating layer 205 is then removed from the bottom 84*a* of the back side trench 84 by anisotropic etching (e.g., by RIE spacer etch) without removing the insulating layer from the sidewalls of the trench 84, as shown in FIG. 12. This etching step exposes p-well 110 through the bottom 84*a* of the trench 84.

Figure 13:
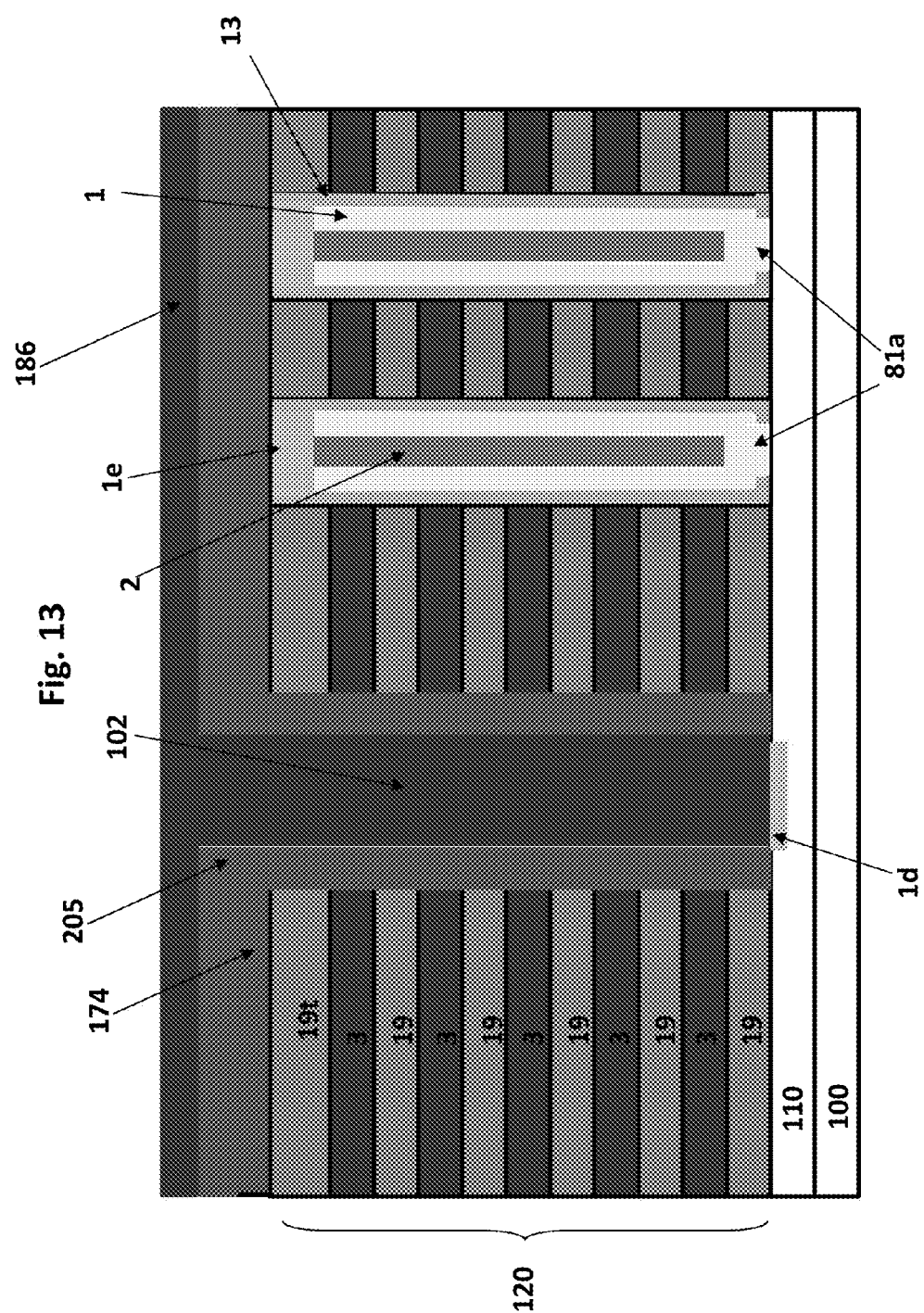
Figure 14:
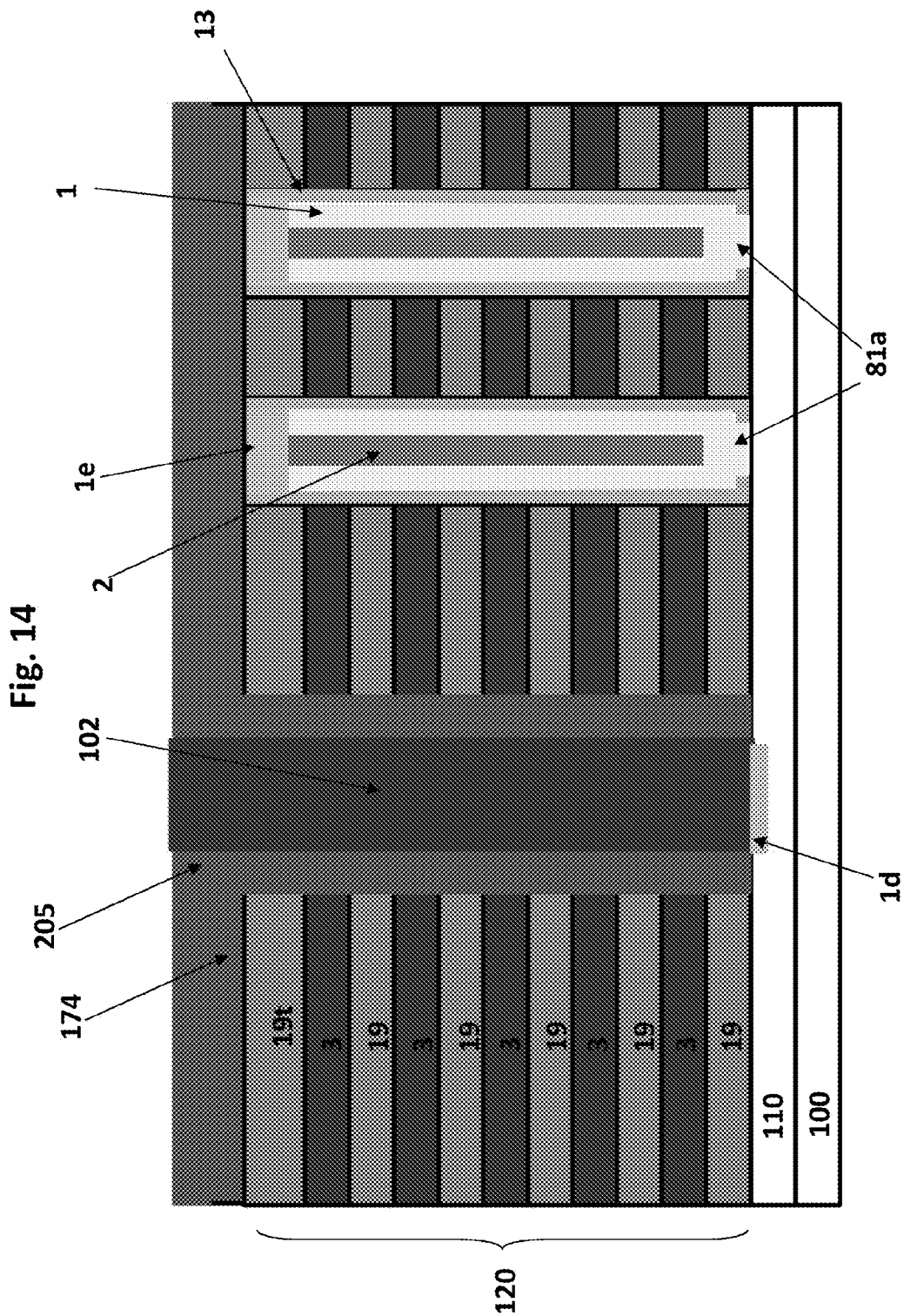

The source electrode 102 is then formed in the back side trench 84 in contact with the source region 1*d* in the p-well 110 in the substrate 100, as shown in FIG. 13. The source region 1*d* may be formed by ion implantation of n-type dopant ions into the p-well through the back side opening 84 before forming the insulating layer 205 (e.g., in the step shown in FIG. 7) or after exposing the p-well 110 (i.e., after the step shown in FIG. 12). The source electrode 102 may be formed by depositing a metal or metal alloy, such as tungsten, tungsten nitride, titanium nitride, ruthenium, etc., over layer 205 in the trenches 84, such as by using the above described ALD process. A portion 186 of the source electrode material located over the device is removed by CMP or etching to leave the source electrode 102 in the dielectrically insulated trenches 84, as shown in FIG. 14.

In an embodiment, at least one charge storage region 9 comprises a plurality of floating gates or a charge storage dielectric layer formed in the front side opening 81. The semiconductor channel 1 comprises polysilicon or amorphous silicon. The blocking dielectric 7 comprises a metal oxide (e.g., aluminum oxide) blocking dielectric. The first material layers 19 comprise silicon oxide layers. The second material layers 121 comprise silicon nitride or polysilicon layers.

Without wishing to be bound by a particular theory, the mechanism of the selective ruthenium deposition process of FIGS. 9C and 10C is explained with reference to FIG. 15. FIG. 15 is a plot comparing the thickness of grown ruthenium as a function of time (i.e. ALD cycles) of a first ruthenium layer 1502 grown on a conductive nucleation liner (e.g., liner regions 42) and a second ruthenium layer 1504 grown on a dielectric (e.g., silicon oxide layers 19 or aluminum blocking dielectric 7) without a nucleation liner. The first ruthenium layer 1502 starts to grow immediately and continues to thicken with each subsequent ALD cycle. In contrast, the second ruthenium layer 1504 does not begin to grow until after an incubation period 1506. The difference in thickness t between the first ruthenium layer 1502 and the second ruthenium layer 1504 remains constant after the incubation period 1506, as both the first and second ruthenium layers 1502, 1504 grow at the same rate after nucleation.

ALD is a surface sensitive deposition process, i.e., the film growth is strongly dependent on the underlying surface characteristics. Without wishing to be bound by a particular theory, it is conjectured that the difference in nucleation is a function of the hydrophobicity of the surfaces, which results in different contact angles for different surfaces. That is, the more hydrophilic the surface, the lower contact angle. Further, a lower contact angle results in a thinner film region. In one embodiment, the conductive nucleation liner regions 42 (e.g., tungsten, tungsten nitride, titanium nitride, ruthenium nitride, tantalum nitride, etc.) can be more hydrophobic than the surfaces of the dielectric layers 19 or 7.

In case the insulating layers 19 comprise silicon oxide, it is believed that less than 25 cycles of $RuO_2$ deposition steps and ruthenium reduction steps results in negligibly small deposition of ruthenium on the surfaces of the insulating layers 19, while continuous portions of ruthenium can be formed on more hydrophobic surfaces such as the nucleation liner surfaces. In one embodiment, the nucleation liner can be a material that is more hydrophobic than silicon oxide layers 19 or aluminum oxide blocking dielectric 7. With less than 25 cycles of the ALD process, ruthenium does not form any contiguous material portion on surfaces of the insulating layer 19, and grows only from the liner regions 42.

Figure 16C:
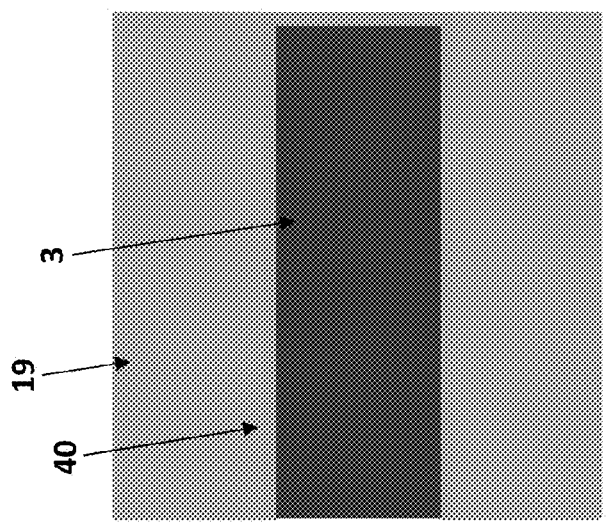
FIGS. 16A-16C are side cross sectional schematic diagrams illustrating a method of selectively filling a back side recess according to an embodiment.
Figure 16B:
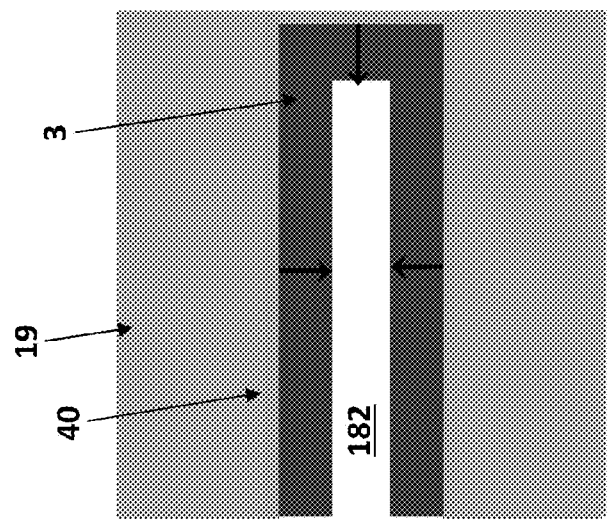
Figure 16A:
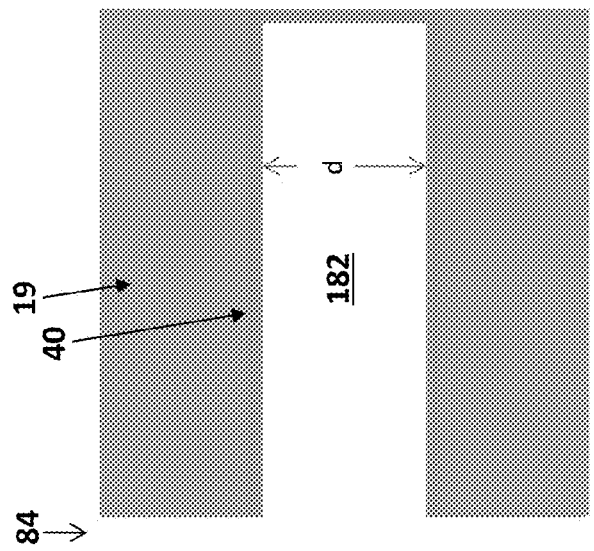

FIGS. 16A-16C are side cross sectional schematic diagrams illustrating the steps in the method of selectively filling a back side recess 182 with ruthenium. As illustrated in FIG. 16A and discussed in more detail above, the back side recess 182 is formed between first layers 19 and clam shaped nucleation liner regions 42 are formed in the back side recesses 182. After forming the nucleation liner regions 42 in the back side recesses 182, the remaining unfilled portions of the back side recesses 182 have a width d (i.e., in the direction perpendicular to surface 100a of the substrate 100) as illustrated in FIG. 16A.

Next, as illustrated in FIGS. 16B and 16C, the ruthenium control gate electrodes 3 are formed in the opening of the clam shaped nucleation liner regions 42 in the back side recesses 182. As illustrated in FIG. 16B, the control gates 3 grow from each surface of the clam shaped nucleation liner 42 toward the center of the back side recesses 182. The back side recesses 182 can be filled without deposition of ruthenium in the back side opening 84 (e.g., on the dielectric 7 or 19 surfaces) if half the width d (i.e. d/2) of the back side recesses 182 after forming the clam shaped nucleation liner regions 42 is less than the thickness t between the first ruthenium layer 1502 and the second ruthenium layer 1504 at the onset of layer growth after the incubation period 1506 as discussed in FIG. 15. That is, the back side recesses 182 can be filled with ruthenium without depositing ruthenium in the back side opening 84 if d/2<t. This results in a thickness d of the ruthenium control gate electrodes 3 in the direction perpendicular to the major surface 100a of the substrate 100 that is less than twice a thickness t at which onset of growth of ruthenium begins on the dielectric surfaces (e.g., the surfaces of the blocking dielectric 7 or the first material layers 19).

In an embodiment, horizontal portions of the electrically conductive clam shaped nucleation liner regions 42 have a smaller thickness in a direction perpendicular to the major surface 100a of the substrate 100 than the ruthenium control gate electrodes 3. In an embodiment, the electrically conductive clam shaped nucleation liner regions 42 have a thickness of 2 to 5 nm, the ruthenium control gate electrodes 3 have a thickness of 10 to 25 nm in a direction perpendicular to the major surface 100a of the substrate 100 and the back side recesses 182 have thickness of 15 to 30 nm in the direction perpendicular to the major surface 100a of the substrate 100 before the liner regions 42 are formed. In an embodiment, the ruthenium control gate electrodes 3 are selectively formed by atomic layer deposition for a first number of atomic layer deposition cycles. The first number of atomic layer deposition cycles is greater than or equal to a number of cycles required to completely fill recesses in the electrically conductive clam shaped nucleation liner regions 42 with ruthenium. The first number of cycles is also less than a number of cycles at which ruthenium incubation delay on the dielectric surfaces (e.g., edges of first material layers 19 or blocking dielectric 7 exposed in the back side opening 84) after which ruthenium deposits on the dielectric surfaces.

FIGS. 17A and 17B are transmission electron micrographs of respective upper and lower portions of a test stack of alternating silicon oxide layers 122 and polysilicon layers 123. The silicon oxide layers 122 are recessed through a trench 84 to leave recesses 182. As illustrated in FIGS. 17A and 17B, a composite tungsten nitride/tungsten nucleation liner regions 42 are formed through the trench 84 in the recesses 182 and ruthenium regions 33 are selectively deposited on the liner regions 42. However, there is no ruthenium deposition on exposed portion 43 of silicon oxide layer 122 that is not covered by the liner region 42, as shown in FIG. 17A. Thus, for a stack of alternating silicon oxide 19 and silicon nitride 121 layers shown in FIG. 7, there is expected to be even less or no ruthenium deposition on the silicon oxide layers 19 that are not covered by the liner region 42 after the silicon nitride layers 121 are removed, as shown in FIGS. 9C and 10C.

The nucleation liner regions 42 are more continuous in the recesses 182 towards the bottom of the trench 84, as shown in FIG. 17B, than toward the top of the trench 84, as shown in FIG. 17A. More complete coverage of the recess 182 surface by the nucleation liner regions 42 typically leads to thicker selectively deposited ruthenium regions 33 on the liner regions 42, as shown in FIG. 17B, compared to the ruthenium regions 33 shown in FIG. 17A. In this example, the nucleation liner layer 40 residue also remains toward the bottom of the trench 84, as shown in FIG. 17B. This residue may be removed by additional etching before deposition of the ruthenium regions 33.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic three dimensional NAND string, comprising:
    forming a stack of alternating layers of insulating first material and a sacrificial second material different from the first material over a major surface of a substrate;
    forming a front side opening in the stack;
    forming at least one charge storage region in the front side opening;
    forming a tunnel dielectric layer over the at least one charge storage region in the front side opening;

forming a semiconductor channel over the tunnel dielectric layer in the front side opening;

forming a back side opening in the stack;

selectively removing at least portions of the second material layers to form back side recesses between adjacent first material layers;

forming an electrically conductive nucleation layer in the back side opening and in the back side recesses;

removing vertical portions of the electrically conductive nucleation layer from inside the back side opening while not removing portions of the electrically conductive nucleation layer located within the backside recesses, wherein remaining portions of the electrically conductive nucleation layer constitute electrically conductive clam shaped nucleation liner regions that are located entirely within the back side recesses; and selectively forming ruthenium control gate electrodes through the back side opening in the respective electrically conductive clam shaped nucleation liner regions after removal of the vertical portions of the electrically conductive nucleation layer from inside the back side opening by depositing ruthenium directly on the electrically conductive claim shaped nucleation liner regions while ruthenium is not deposited over sidewalls of the first material layers within the back side opening.

2. The method of claim 1, further comprising forming a blocking dielectric between the control gate electrodes and the at least one charge storage region.

3. The method of claim 2, wherein:

the step of selectively removing at least portions of the second material layers comprises selectively etching the second material layers through the back side opening to form the back side recesses;

the step of forming the blocking dielectric comprises forming the blocking dielectric in the front side opening over the at least one charge storage region, or through the back side opening in the back side recesses on exposed portions of the at least one charge storage region; and the step of selectively forming the ruthenium control gate electrodes comprises selectively forming ruthenium regions on respective the electrically conductive clam shaped nucleation liner regions without forming ruthenium on sidewalls of the first material layers exposed in the back side opening in the stack.

4. The method of claim 3, wherein sidewalls of the first material layers are physically exposed in the back side opening after removing the vertical portions of the nucleation liner from inside the back side opening.

5. The method of claim 4, wherein selectively forming the ruthenium control gate electrodes comprises selectively forming the ruthenium control gate electrodes by atomic layer deposition.

6. The method of claim 5, wherein:

the electrically conductive clam shaped nucleation liner regions comprise at least one of tungsten, tungsten nitride, titanium nitride, ruthenium nitride or tantalum nitride; and the first material layers comprise silicon oxide layers.

7. The method of claim 6, wherein horizontal portions of the electrically conductive clam shaped nucleation liner regions have a smaller thickness in a direction perpendicular to the major surface of the substrate than the ruthenium control gate electrodes.

8. The method of claim 6, wherein:

the electrically conductive clam shaped nucleation liner regions have a thickness of 2 to 5 nm;

the ruthenium control gate electrodes have a thickness of 10 to 25 nm in a direction perpendicular to the major surface of the substrate; and the back side recesses have thickness of 15 to 30 nm in the direction perpendicular to the major surface of the substrate.

9. The method of claim 6, wherein a thickness of the ruthenium control gate electrodes in the direction perpendicular to the major surface of the substrate is less than twice a thickness at which onset of growth of ruthenium begins on the first material layers exposed in the back side opening or on the blocking dielectric if the blocking dielectric is exposed in the back side opening.

10. The method of claim 6, wherein:

the ruthenium control gate electrodes are selectively formed by atomic layer deposition for a first number of atomic layer deposition cycles;

the first number of atomic layer deposition cycles is greater than or equal to a number of cycles required to completely fill recesses in the electrically conductive clam shaped nucleation liner regions with ruthenium; and the first number of cycles is less than a number of cycles at which ruthenium incubation delay on the first material layers ends, and at which ruthenium deposits on the first material layers.

11. The method of claim 5, wherein selectively forming the ruthenium control gate electrodes by atomic layer deposition comprises:

(a) using a $RuO_4$ precursor to deposit one or more $RuO_2$ monolayers using atomic layer deposition;

(b) exposing the one or more $RuO_2$ monolayers to a reducing atmosphere to reduce the deposited one or more $RuO_2$ monolayers to one or more Ru monolayers; and (c) repeating steps (a) and (b) a plurality of times to selectively form the ruthenium control gate electrodes.

12. The method of claim 2, wherein:

the at least one charge storage region comprises a plurality of floating gates or a charge storage dielectric layer formed in the front side opening;

the semiconductor channel comprises polysilicon or amorphous silicon;

the blocking dielectric comprises a metal oxide blocking dielectric;

the first material layers comprise silicon oxide layers; and the second material layers comprise silicon nitride or polysilicon layers.

13. The method of claim 1, further comprising:

forming a source region of the NAND string in or over the substrate through the back side opening;

forming an insulating layer in the back side opening;

removing a bottom portion of the insulating layer to expose the source region; and forming a source line in the back side opening in contact with the source region.

14. The method of claim 13, wherein:

the substrate comprises a silicon substrate;

the monolithic three dimensional NAND string is located in an array of monolithic three dimensional NAND strings over the silicon substrate;

the control gate electrodes comprise at least a first control gate electrode located in a first device level and a second control gate electrode located in a second device level located over the major surface of the substrate and below the first device level;

at least one memory cell in the first device level of the three dimensional array of NAND strings is located over another memory cell in the second device level of the three dimensional array of NAND strings; and the silicon substrate contains an integrated circuit comprising a driver circuit for the memory device located thereon.

15. The method of claim 1, wherein the at least one charge storage region is formed in the front side opening prior to selectively removing at least portions of the second material layers.

16. The method of claim 1, wherein the tunnel dielectric layer is formed after formation of the at least one charge storage region and directly on a sidewall of the at least one charge storage region.

17. The method of claim 1, wherein the semiconductor channel is formed directly on the tunneling dielectric layer prior to selectively removing at least portions of the second material layers.

18. The method of claim 1, wherein the electrically conductive nucleation layer includes a material selected from tungsten nitride, titanium nitride, ruthenium nitride, and tantalum nitride.

19. The method of claim 1, wherein the electrically conductive nucleation layer includes a tungsten layer, and the ruthenium control gate electrodes are formed by nucleating and depositing ruthenium on surfaces of the tungsten layer.

20. The method of claim 1, wherein each of the electrically conductive clam shaped nucleation liner region is separated from each other in a direction perpendicular to the major surface of the substrate by the first material layers.

21. The method of claim 1, further comprising:
forming a blocking dielectric in the front side opening; and
forming a memory film including the at least one charge storage region is formed directly on the blocking dielectric in the front opening.

22. The method of claim 21, wherein at least one of the electrically conductive clam shaped nucleation liner regions includes a vertical portion that physically contacts the blocking dielectric, an upper horizontal portion that physically contacts an overlying first material layer, and an lower horizontal portion that physically contacts an underlying first material layer.

23. The method of claim 1, further comprising forming a backside blocking dielectric layer in the backside recesses and in the back side opening prior to forming the electrically conductive nucleation layer, wherein sidewalls of the backside blocking dielectric layer are physically exposed after removing the vertical portions of the electrically conductive nucleation layer from inside the back side opening.

24. The method of claim 23, wherein at least one of the electrically conductive clam shaped nucleation liner regions includes a vertical portion that physically contacts a vertical portion of the backside blocking dielectric layer, an upper horizontal portion that physically contacts an overlying horizontal portion of the backside blocking dielectric layer, and an lower horizontal portion that physically contacts an underlying horizontal portion of the backside blocking dielectric layer.

* * * * *